United States Patent
Nemani et al.

(10) Patent No.: US 7,524,750 B2
(45) Date of Patent: Apr. 28, 2009

(54) INTEGRATED PROCESS MODULATION (IPM) A NOVEL SOLUTION FOR GAPFILL WITH HDP-CVD

(75) Inventors: Srinivas D. Nemani, Sunnyvale, CA (US); Young S. Lee, San Jose, CA (US); Ellie Y. Yieh, San Jose, CA (US); Anchuan Wang, Sunnyvale, CA (US); Jason Thomas Bloking, Mountain View, CA (US); Lung-Tien Han, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 253 days.

(21) Appl. No.: 11/553,772

(22) Filed: Oct. 27, 2006

(65) Prior Publication Data
US 2007/0243693 A1 Oct. 18, 2007

Related U.S. Application Data (60) Provisional application No. 60/792,743, filed on Apr. 17, 2006.

(51) Int. Cl.
*H01L 21/20* (2006.01)
(52) U.S. Cl. .................. 438/597; 438/624; 438/694; 438/758; 257/E21.276; 257/E21.279; 257/E21.291; 257/E21.546; 257/E21.576
(58) Field of Classification Search ................ 438/597, 438/624, 694, 758; 257/E21.276, 279, 291, 257/546, 576, 579
See application file for complete search history.

(56) References Cited

U.S. PATENT DOCUMENTS

| | | |
|---|---|---|
| 4,468,413 A | 8/1984 | Bachmann |
| 4,690,746 A | 9/1987 | McInerney et al. |
| 4,851,370 A | 7/1989 | Doklan et al. |

(Continued)

FOREIGN PATENT DOCUMENTS

EP 0 496 543 A2 7/1992

(Continued)

OTHER PUBLICATIONS

Abraham, "Reactive Facet Tapering of Plasma Oxide For Multilevel Interconnect Applications," VMIC Conference. pp. 115-121 (1987).

(Continued)

*Primary Examiner*—Michael S Lebentritt
(74) *Attorney, Agent, or Firm*—Townsend and Townsend and Crew LLP (57) ABSTRACT

A process is provided for depositing an silicon oxide film on a substrate disposed in a process chamber. A process gas that includes a halogen source, a fluent gas, a silicon source, and an oxidizing gas reactant is flowed into the process chamber. A plasma having an ion density of at least $10^{11}$ ions/cm$^3$ is formed from the process gas. The silicon oxide film is deposited over the substrate with a halogen concentration less than 1.0%. The silicon oxide film is deposited with the plasma using a process that has simultaneous deposition and sputtering components. The flow rate of the halogen source to the process chamber to the flow rate of the silicon source to the process chamber is substantially between 0.5 and 3.0.

21 Claims, 5 Drawing Sheets

U.S. PATENT DOCUMENTS

| | | | |
|---|---|---|---|
| 4,872,947 A | 10/1989 | Wang et al. | |
| 4,892,753 A | 1/1990 | Wang et al. | |
| 4,894,352 A | 1/1990 | Lane et al. | |
| 4,960,488 A | 10/1990 | Law et al. | |
| 5,000,113 A | 3/1991 | Wang et al. | |
| 5,013,691 A | 5/1991 | Lory et al. | |
| 5,061,838 A | 10/1991 | Lane et al. | |
| 5,089,442 A | 2/1992 | Olmer | |
| 5,156,881 A | 10/1992 | Okano et al. | |
| 5,215,787 A | 6/1993 | Homma | |
| 5,252,178 A | 10/1993 | Moslehi | |
| 5,271,972 A | 12/1993 | Kwok et al. | |
| 5,275,977 A | 1/1994 | Otsubo et al. | |
| 5,279,865 A | 1/1994 | Chebi et al. | |
| 5,288,518 A | 2/1994 | Homma | |
| 5,290,382 A | 3/1994 | Zarowin et al. | |
| 5,302,233 A | 4/1994 | Kim et al. | |
| 5,314,724 A | 5/1994 | Tsukune et al. | |
| 5,319,247 A | 6/1994 | Matsuura | |
| 5,334,552 A | 8/1994 | Homma | |
| 5,362,526 A | 11/1994 | Wang et al. | |
| 5,385,763 A | 1/1995 | Okano et al. | |
| 5,399,529 A | 3/1995 | Homma | |
| 5,413,967 A | 5/1995 | Matsuda et al. | |
| 5,416,048 A | 5/1995 | Blalock et al. | |
| 5,420,075 A | 5/1995 | Homma et al. | |
| 5,429,995 A | 7/1995 | Nishiyama et al. | |
| 5,468,342 A | 11/1995 | Nulty et al. | |
| 5,474,589 A | 12/1995 | Ohga et al. | |
| 5,563,105 A | 10/1996 | Dobuzinsky et al. | |
| 5,571,576 A | 11/1996 | Qian et al. | |
| 5,599,740 A | 2/1997 | Jang et al. | |
| 5,624,582 A | 4/1997 | Cain | |
| 5,645,645 A | 7/1997 | Zhang et al. | |
| 5,648,175 A | 7/1997 | Russell et al. | |
| 5,661,093 A | 8/1997 | Ravi et al. | |
| 5,679,606 A * | 10/1997 | Wang et al. | 438/763 |
| 5,712,185 A | 1/1998 | Tsai et al. | |
| 5,719,085 A | 2/1998 | Moon et al. | |
| 5,756,402 A | 5/1998 | Jimbo et al. | |
| 5,804,259 A | 9/1998 | Robles | |
| 5,850,105 A | 12/1998 | Dawson et al. | |
| 5,858,876 A | 1/1999 | Chew | |
| 5,872,052 A | 2/1999 | Iyer | |
| 5,872,058 A | 2/1999 | Van Cleemput et al. | |
| 5,891,349 A | 4/1999 | Tobe et al. | |
| 5,913,140 A | 6/1999 | Roche et al. | |
| 5,915,190 A | 6/1999 | Pirkle | |
| 5,920,792 A | 7/1999 | Lin | |
| 5,937,323 A * | 8/1999 | Orczyk et al. | 438/624 |
| 5,939,831 A | 8/1999 | Fong et al. | |
| 5,944,902 A | 8/1999 | Redeker et al. | |
| 5,953,635 A | 9/1999 | Andideh | |
| 5,968,610 A | 10/1999 | Liu et al. | |
| 5,976,327 A | 11/1999 | Tanaka | |
| 5,990,000 A | 11/1999 | Hong et al. | |
| 5,990,013 A | 11/1999 | Berenguer et al. | |
| 6,013,191 A | 1/2000 | Nasser-Faili et al. | |
| 6,013,584 A | 1/2000 | M'Saad | |
| 6,030,666 A | 2/2000 | Lam et al. | |
| 6,030,881 A | 2/2000 | Papasouliotis et al. | |
| 6,037,018 A | 3/2000 | Jang et al. | |
| 6,039,851 A | 3/2000 | Iyer | |
| 6,059,643 A | 5/2000 | Hu et al. | |
| 6,077,764 A * | 6/2000 | Sugiarto et al. | 438/597 |
| 6,087,278 A | 7/2000 | Kim et al. | |
| 6,099,697 A | 8/2000 | Hausmann | |
| 6,136,685 A | 10/2000 | Narwankar et al. | |
| 6,150,628 A | 11/2000 | Smith et al. | |
| 6,167,834 B1 | 1/2001 | Wang et al. | |
| 6,170,428 B1 | 1/2001 | Redeker et al. | |
| 6,182,602 B1 | 2/2001 | Redeker et al. | |
| 6,189,483 B1 | 2/2001 | Ishikawa et al. | |
| 6,190,233 B1 | 2/2001 | Hong et al. | |
| 6,191,026 B1 | 2/2001 | Rana et al. | |
| 6,194,038 B1 | 2/2001 | Rossman | |
| 6,197,691 B1 | 3/2001 | Lee | |
| 6,197,705 B1 | 3/2001 | Vassiliev | |
| 6,200,911 B1 * | 3/2001 | Narwankar et al. | 438/758 |
| 6,203,863 B1 | 3/2001 | Liu et al. | |
| 6,204,200 B1 | 3/2001 | Shieh et al. | |
| 6,217,658 B1 | 4/2001 | Orczyk et al. | |
| 6,228,751 B1 | 5/2001 | Yamazaki et al. | |
| 6,335,288 B1 * | 1/2002 | Kwan et al. | 438/694 |
| 6,395,150 B1 | 5/2002 | Van Cleemput et al. | |
| 6,503,843 B1 | 1/2003 | Xia et al. | |
| 6,596,654 B1 | 7/2003 | Bayman et al. | |
| 6,602,434 B1 | 8/2003 | Hung et al. | |
| 6,794,290 B1 | 9/2004 | Papasouliotis et al. | |
| 6,797,646 B2 * | 9/2004 | Ngai et al. | 438/778 |
| 6,802,944 B2 * | 10/2004 | Ahmad et al. | 204/192.23 |
| 6,808,748 B2 | 10/2004 | Kapoor et al. | |
| 6,846,745 B1 | 1/2005 | Papasouliotis et al. | |
| 6,869,880 B2 | 3/2005 | Krishnaraj et al. | |
| 6,890,403 B2 * | 5/2005 | Cheung et al. | 156/345.53 |
| 6,908,862 B2 | 6/2005 | Li et al. | |
| 7,052,552 B2 * | 5/2006 | Kwan et al. | 118/697 |
| 2001/0028922 A1 | 10/2001 | Sandhu | |
| 2002/0187655 A1 | 12/2002 | Tan et al. | |
| 2003/0127427 A1 * | 7/2003 | Yuan et al. | 216/63 |

FOREIGN PATENT DOCUMENTS

| | | |
|---|---|---|
| JP | 61-276977 A | 12/1986 |
| JP | 2058836 A | 2/1990 |
| JP | 4-239750 | 7/1992 |
| JP | 4-341568 A | 11/1992 |
| JP | 7-161703 A | 6/1995 |
| WO | WO 92/20833 A1 | 11/1992 |

OTHER PUBLICATIONS

Chang et al. "Frequency Effects and Properties of Plasma Deposited Fluorinated Silicon Nitride", American Vacuum Society. 1988. pp. 524-532.

Cheng, L.-Y. et al., "New Test Structure to Identify Step Coverage Mechanisms in Chemical Vapor Deposition of Silicon Dioxide," Appl. Phys. Lett., 58 (19), May 13, 1991, p. 2147-2149.

Fukada et al. "Preparation of SiOF Films with Low Dielectric Constant By ECR Plasma CVD", Japan. DUMIC Conference. Feb. 1995. pp. 43-49.

Galiano et al. "Stress-Temperature Behavior of Oxide Films Used for Intermetal Dielectric Applications", VMIC Conference. Jun. 1992. pp. 100-106.

Hausmann, D. et al., "Rapid Vapor Deposition of Highly Conformal Nanolaminates," Science, 298, Oct. 11, 2002, p. 402-406.

Hayasaka, N. et al. "High Quality Low Dielectric Constant SiO2 CVD Using High Density Plasma," Proceedings of the Dry Process Symposium, 1993, pp. 163-168.

Laxman, "Low ε Dielectrics: CVD Fluorinated Silicon Dioxides", Semiconductor International. May 1995. pp. 71-74.

Lee et al., "Dielectric Planarization Techniques For Narrow Pitch Multilevel Interconnects," VMIC Conference, pp. 85-92 (1987).

Matsuda et al. "Dual Frequency Plasma CVD Fluorosilicate Glass: Deposition for 0.25 um Interlevel Dielectrics", DUMIC Conference. Feb. 1995. pp. 22-28.

Meeks et al., "Modeling of SiO2 deposition in high density plasma reactors and comparisons of model predictions with experimental measurements," J. Vac. Sci. Technol. A, 16(2):544-563 (1998).

Musaka, "Single Step Gap Filling Technology fo Subhalf Micron Metal Spacings on Plasma Enhanced TEOS/O2 Chemical Vapor Deposition System," International Conference on Solid State Devices and Materials pp. 510-512, held in Japan, (1993).

Ota, K. et al., "Stress Controlled Shallow Trench Isolation Technology to Suppress the Novel Anti-Isotropic Impurity Diffusion for 45nm-Node High Performance CMOSFETs," Symposium on VLSI Technology Digest of Technical Papers, 2005, p. 138-139.

Qian et al., "High Density Plasma Deposition and Deep Submicron Gap Fill with Low Dielectric Constant SiO2 Films," DUMIC Conference, Feb. 21-22, 1995, pp. 50-56, held in California.

Robles et al. "Effects of RF Frequency and Deposition Rates on the Moisture Resistance of PECVD TEOS-Based Oxide Films", ECS Extended Abstracts. vol. 92-1. May 1992. pp. 215-216.

Shapiro et al. "Dual Frequency Plasma CVD Fluorosilicate Glass: Water Absorption And Stability", DUMIC Conference. Feb. 1995. pp. 118-123.

Usami et al. "Low Dielectric Constant Interlayer Using Fluorine-Doped Silicon Oxide", Jpn. J. Appl. Phys. vol. 33, Jan. 1994. pp. 408-412.

Vassiliev et al., "Trends in void-free pre-metal CVD dielectrics," Solid State Technology, Mar. 2001, pp. 129-136, www.solid-state.com.

Yu et al. "Step Coverage Study of Peteos Deposition for Intermetal Dielectric Applications", VMIC Conference. Jun. 1990. pp. 166-172.

* cited by examiner

INTEGRATED PROCESS MODULATION (IPM) A NOVEL SOLUTION FOR GAPFILL WITH HDP-CVD

CROSS-REFERENCE TO RELATED APPLICATIONS

This application claims priority to U.S. Provisional Patent Application No. 60/792,743, filed Apr. 17, 2006, entitled "INTEGRATED PROCESS MODULATION (IPM) A NOVEL SOLUTION FOR FILLING NARROW GAPS (<90 NM) WITH HDP-CVD-S," the entire disclosure of which is incorporated herein by reference for all purposes.

BACKGROUND OF THE INVENTION

One of the primary steps in the fabrication of modern semiconductor devices is the formation of a film, such as a silicon oxide, on a semiconductor substrate. Silicon oxide is widely used as an insulating layer in the manufacture of semiconductor devices. As is well known, a silicon oxide film can be deposited by thermal chemical vapor deposition (CVD) or a plasma chemical vapor deposition process, among other techniques. In a conventional thermal CVD process, reactive gases are supplied to the substrate surface where heat-induced chemical reactions (homogeneous or heterogeneous) take place to produce a desired film. In a conventional plasma process, a controlled plasma is formed to decompose and/or energize reactive species to produce the desired film.

Semiconductor device geometries have dramatically decreased in size since such devices were first introduced several decades ago. Smaller feature sizes have resulted in the presence of increased aspect ratio gaps for some applications, for example, between adjacent conductive lines or in etched trenches. The aspect ratio of a gap is defined by the ratio of the gap's height or depth to its width. These spaces are difficult to fill using conventional CVD methods. A film's ability to completely fill such gaps is referred to as the film's "gapfilling" ability. Silicon oxide is one type of insulation film that is commonly used to fill the gaps in intermetal dielectric (IMD) applications, premetal dielectric (PMD) applications and shallow trench isolation (STI) applications among others. Such a silicon oxide film is often referred to as a gapfill film or a gapfill layer.

Some integrated circuit manufacturers have turned to the use of high density plasma CVD (HDP-CVD) systems to deposit silicon oxide gapfill layers. HDP-CVD systems form a plasma that is approximately two orders of magnitude or greater than the density of a standard, capacitively-coupled plasma CVD system. Examples of HDP-CVD systems include inductively-coupled plasma systems and electron cyclotron resonance (ECR) plasma systems among others. HDP-CVD systems generally operate at lower pressure ranges than low density plasma systems. The low chamber pressure employed in HDP-CVD systems provides active species having a long mean-free-path and reduced angular distribution. These factors, in combination with the plasma's density, contribute to a significant number of constituents from the plasma reaching even the deepest portions of closely spaced gaps, providing a film with improved gapfill capabilities as compared to films deposited in a low density plasma CVD system.

Another factor that allows films deposited by HDP-CVD techniques to have improved gapfill characteristics as compared to films deposited by other CVD techniques is the occurrence of sputtering, promoted by the plasma's high density, simultaneous with film deposition. The sputtering element of HDP deposition slows deposition on certain features, such as the corners of raised surfaces, thereby contributing to the increased gapfill ability of HDP deposited films. Some HDP-CVD systems introduce argon or a similar heavy inert gas to further promote the sputtering effect. These HDP-CVD systems typically employ an electrode within the substrate support pedestal that enables the creation of an electric field to bias the plasma toward the substrate. The electric field can be applied throughout the HDP deposition process to generate sputtering and provide better gapfill characteristics for a given film. One HDP-CVD process commonly used to deposit a silicon oxide film forms a plasma from a process gas that includes silane ($SiH_4$), molecular oxygen ($O_2$) and argon (Ar).

However, a limitation associated with sputtering is an angular redistribution of sputtered material. For example, in an STI gapfill, the sputtered $SiO_2$ can be sputtered from above the trench and deposit on the sides of the trench, causing excess buildup, and limiting the opening through which bottom-up gapfill is achieved. If there is too much re-deposition, the trench can close off before the bottom is filled, leaving a buried void within the trench.

Figure 1A:
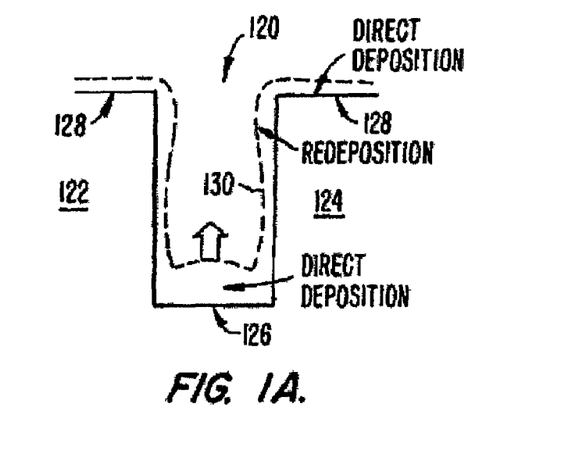
FIGS. 1A-1C are simplified cross-sectional views of an HDP-CVD silicon oxide film at different stages of deposition in a high aspect ratio gapfill application.
Figure 1B:
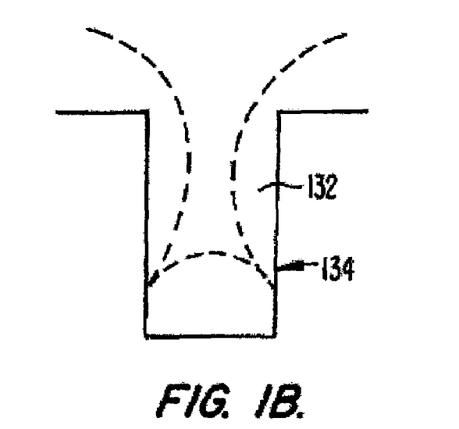
Figure 1C:
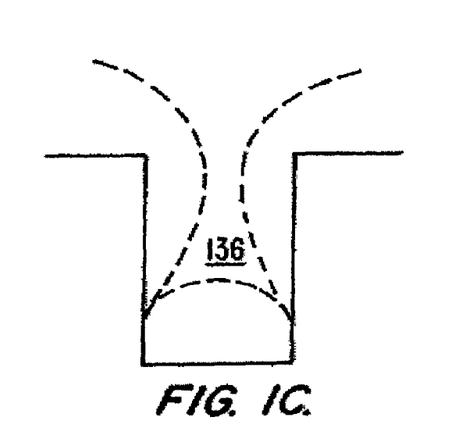

FIG. 1A shows the initial stages of film deposition over a substrate (not shown) having a gap 120 defined by two adjacent features 122, 124 formed over the substrate. As shown in FIG. 1A, the conventional HDP-CVD silicon oxide deposition process results in direct silicon oxide deposition on horizontal surface 126 within gap 120 and horizontal surfaces 128 above features 122, 124. The process also results in indirect deposition (referred to as re-deposition) of silicon oxide on sidewalls 130 due to the recombination of material sputtered from the silicon oxide film as it grows. In certain small-width, high-aspect-ratio applications, the continued growth of the silicon oxide film results in formations 132 on the upper section gap sidewall that grow toward each other at a rate of growth exceeding the rate at which the film grows laterally on lower portions 134 of the sidewall (see FIG. 1B also). The final result of this process is that a void 136 forms as shown in FIG. 1C.

With tighter trenches, the risk of closing the trench before the bottom-up fill is complete becomes greater, even with the lighter atoms. The He process has been able to provide a gapfill solution down to 110 nm and the $H_2$ process has extended HDP-CVD down to 65 nm. Spin-on dielectric and ALD (atomic layer deposition) films have shown gapfill capabilities down to much tighter structures than HDP-CVD has been able to fill, but customers are somewhat reluctant to make the switch for other reasons such as film shrinkage and reliability.

Another method to keep the top of the trench open and allow the bottom-up fill to be completed is to use a dry $NF_3$-based plasma etch at the point of the process where the trench has nearly closed, as described in U.S. Pat. No. 6,908,862, which is hereby incorporated by reference for all purposes. The $NF_3$ dissociates in the plasma, forming reactive fluorine radicals. These radicals are able to break the Si—O bond in the deposited film, forming $SiF_4$, a volatile species, according to:

The $SiF_4$ is pumped out along with the excess $O_2$, removing the deposited film and opening up the trench. This Dep-Etch-Dep ("DED") process provides a small but significant margin to the original process in terms of gapfill.

Generally, in a conventional DED process, each deposition step uses different process conditions optimized for the characteristics of the substrate prior to the deposition step. For example, the initial deposition step "dep1" may deposit a relatively thin layer, intended to protect the sidewalls of the trench from the subsequent etching step "etch1". The second deposition step "dep2" typically includes deposition of a relatively thicker layer.

If the DED includes further deposition and etching steps, then each individual deposition step (dep1, dep2, a third deposition "dep3," and so on) and each individual etch step (etch1, a second etch "etch2," and so on) is typically designed with conditions optimized specifically for that step. For example, dep2 is typically optimized based on the profile of the layer at the completion of etch1, dep3 is optimized based on the profile of the layer at the completion of etch2, and so on.

A disadvantage of conventional DED processes with separately tuned processes for each deposition and etch step is that each step generally needs to be separately qualified in manufacturing. In other words, before installing a DED process in a production manufacturing line, a number of substrates are generally run on dep1 to qualify dep1, a number of substrates are generally run on etch1 to qualify etch1, and so on.

BRIEF SUMMARY OF THE INVENTION

Embodiments of the present invention pertain to a method and apparatus for depositing silicon oxide films having improved gapfill capabilities. Embodiments of the method of the invention deposit such films using HDP-CVD deposition techniques and are particularly useful for pre-metal dielectric and shallow trench isolation applications in the manufacture of integrated circuits having minimum feature sizes of 0.10 microns or less. As used herein, a high density plasma is a plasma having an ion density of at least $1 \times 10^{11}$ ions/cm$^3$.

The process disclosed herein involves a sequential alternation of low-temperature (less than 400° C.) deposition followed by etching. Each low-temperature deposition is followed by an etch so that, for an STI application for example, the opening of the trench is kept open and bottom-up gapfill may proceed to completion substantially without voids. In contrast to a traditional DED process using deposition temperatures of greater than 400° C. to improve bottom fill, the process described further herein involves deposition temperatures less than 400° C., and even as low as room temperature (or below). The process involves, under software control, repetition of a predetermined number of cycles of substantially the same deposition and etch processes.

Therefore, in one aspect, a method for filling a pre-metal deposition trench formed on a substrate comprises executing a cycle including depositing a layer on the substrate in a high density CVD chamber, the substrate cooled to less than 400° C., and etching a portion of the deposited layer on the substrate in the chamber. The method further comprises repeating the cycle of depositing the layer and etching the portion of the layer for a predetermined number of cycles. In some embodiments, the predetermined number of cycles is at least four.

In various optional embodiments, the method may comprise flowing a backside cooling gas to cool a platform thermally coupled to the substrate. Depositing the layer may comprise generating a plasma including deposition gases and sputtering gases, wherein a ratio of depositing to sputtering is in the range of 10:1 to 60:1. In some embodiments, etching may comprise allowing the substrate to heat to a temperature above the deposition temperature, and may comprise a multiple step etch of an anisotropic etch and an isotropic etch. In some embodiments, etching the portion of the deposited layer in an initial cycle may be stopped by an endpoint technique, and etching a portion of the deposited layer in a subsequent cycle may be stopped by time.

The method may optionally comprise depositing the layer by cooling the substrate to less than 400° C., and after repeating the depositing-etching cycle the predetermined number of cycles, heating the substrate to reduce moisture in the layer. In some embodiments, the method may comprise, before initiating the depositing-etching cycle, seasoning the chamber with a silicon-rich deposit to prevent attack of the chamber by etching gases used in etching the portion of the layer (e.g., with a seasoning deposition in the chamber that is 4 to 20 times thicker than a deposition thickness of a single layer).

In some embodiments, depositing the layer may comprise depositing less than about 1000 Å in each cycle into a gap that has a depth greater than about 4000 Å. For example in one embodiment, each subsequent deposition-etching cycle results in less than 700 Å of deposition at the bottom of a gap that is greater than about 4000 Å in height. Each deposition-etching cycle may use substantially the same process conditions as used in initial cycles (e.g., the process conditions do not vary by more than 10% from the process conditions used in initial cycles). Alternatively, each deposition-etching cycle may provide substantially the same deposition and etching result on the substrate (e.g., the thickness of a layer deposited in each cycle varies by no more than ±10% from the thickness deposited in other cycles, and the amount of material removed in each cycle varies by no more than ±10% from the amount removed in other cycles). The deposition-etching cycle may be repeated a predetermined number of times (e.g., 4 or more times) to fill the gap.

DETAILED DESCRIPTION OF THE INVENTION

Introduction

Embodiments of the invention pertain to a high-density-plasma chemical-vapor-deposition ("HDP-CVD") method applicable, for example, to depositing layers in shallow trench isolation ("STI") applications. Embodiments of the invention permit material to be deposited with substantially 100% gapfill for integrated circuits having small feature sizes (90 nm or less). Bottom-up gapfill may be achieved inside very aggressive trenches having high aspect ratios.

Embodiments of the present invention can be implemented using a variety of high density plasma CVD substrate processing chambers including chambers in which a plasma is formed by the application of RF energy to a coil that at least partially surrounds a portion of the chamber and chambers that use ECR plasma formation techniques. An example of an inductively-coupled HDP-CVD chamber in which embodiments of the method of the present invention can be practiced is set forth below.

Exemplary Substrate Processing System

Figure 2A:
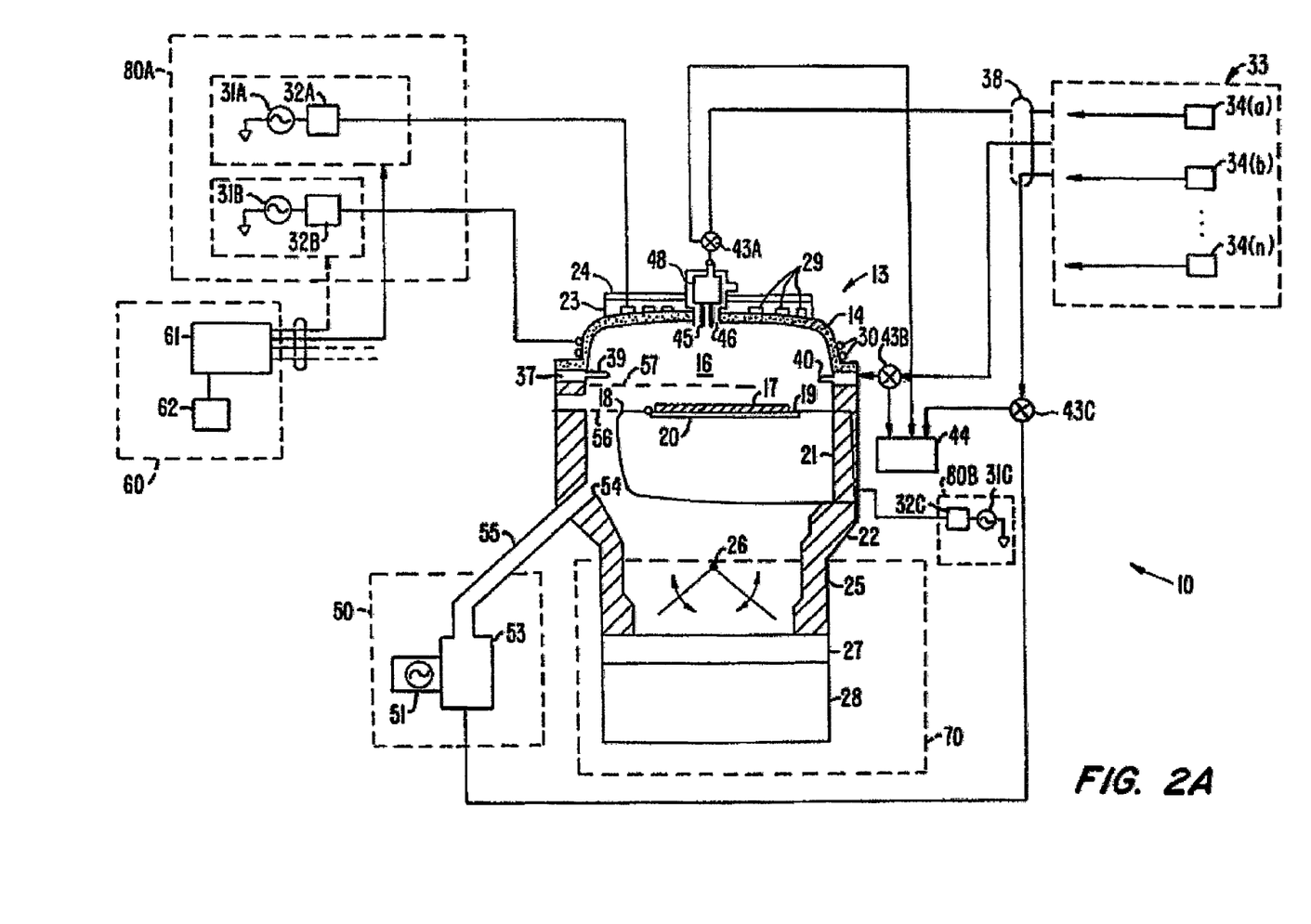
FIG. 2A is a simplified, cross-sectional view of an exemplary substrate processing system with which embodiments of the present invention may be used.

FIG. 2A illustrates one embodiment of a high density plasma chemical vapor deposition (HDP-CVD) system 10 in which a dielectric layer according to the present invention can be deposited. System 10 includes a chamber 13, a substrate support 18, a gas delivery system 33, a remote plasma cleaning system 50, a vacuum system 70, a source plasma system 80A, a bias plasma system 80B.

The upper portion of chamber 13 includes a dome 14, which is made of a ceramic dielectric material, such as aluminum oxide or aluminum nitride. Dome 14 defines an upper boundary of a plasma processing region 16. Plasma processing region 16 is bounded on the bottom by the upper surface of a substrate 17 and a substrate support 18, which is also made from an aluminum oxide or aluminum ceramic material.

A heater plate 23 and a cold plate 24 surmount and are thermally coupled to dome 14. Heater plate 23 and cold plate 24 allow control of the dome temperature to within about ±10° C. over a range of about 100° C. to 200° C. Generally, exposure to the plasma heats a substrate positioned on substrate support 18. Substrate support 18 includes inner and outer passages (not shown) that can deliver a heat transfer gas (sometimes referred to as a backside cooling gas) to the backside of the substrate. As described further below, the backside cooling gas can cool the substrate to temperatures significantly less than 400° C.

The lower portion of chamber 13 includes a body member 22 which joins the chamber to the vacuum system. A base portion 21 of substrate support 18 is mounted on and forms a continuous inner surface with body member 22. Substrates are transferred into and out of chamber 13 by a robot blade (not shown) through an insertion/removal opening (not shown) in the side of chamber 13. Lift pins (not shown) are raised and then lowered under the control of a motor (also not shown) to move the substrate from the robot blade at an upper loading position 57 to a lower processing position 56 in which the substrate is placed on a substrate receiving portion 19 of substrate support 18. Substrate receiving portion 19 includes an electrostatic chuck 20 that can be used to secure the substrate to substrate support 18 during substrate processing.

Vacuum system 70 includes throttle body 25, which houses twin-blade throttle valve 26 and is attached to gate valve 27 and turbo-molecular pump 28. Gate valve 27 can isolate pump 28 from throttle body 25, and can also control chamber pressure by restricting the exhaust flow capacity when throttle valve 26 is fully open. The arrangement of the throttle valve, gate valve, and turbo-molecular pump allow accurate and stable control of chamber pressures as low as about 1 mTorr.

Source plasma system 80A is coupled to a top coil 29 and side coil 30 mounted on dome 14. A symmetrical ground shield (not shown) reduces electrical coupling between the coils. Top coil 29 is powered by top source RF (SRF) generator 31A, whereas side coil 30 is powered by side SRF generator 31B, allowing independent power levels and frequencies of operation for each coil. In a specific embodiment the top source RF generator 31A provides up to 10,000 watts of RF power at nominally 2 MHz and the side source RF generator 31B provides up to 10,000 watts of RF power at nominally 2 MHz. The operating frequencies of the top and side RF generators may be offset from the nominal operating frequency (e.g. to 1.7-1.9 MHz and 1.9-2.1 MHz, respectively) to improve plasma-generation efficiency.

A bias plasma system 80B includes a bias RF (BRF) generator 31C and a bias matching network 32C. The bias plasma system 80B capacitively couples substrate portion 17 to body member 22, which act as complimentary electrodes. The bias plasma system 80B serves to enhance the transport of plasma species (e.g., ions) created by the source plasma system 80A to the surface of the substrate. In a specific embodiment, bias RF generator provides up to 10,000 watts of RF power at 13.56 MHz.

RF generators 31A and 31B include digitally controlled synthesizers and operate over a frequency range between about 1.8 to about 2.1 MHz. Each generator includes an RF control circuit (not shown) that measures reflected power from the chamber and coil back to the generator and adjusts the frequency of operation to obtain the lowest reflected power, as understood by a person of ordinary skill in the art. Matching networks 32A and 32B match the output impedance of generators 31A and 31B with their respective coils 29 and 30. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

A gas delivery system 33 provides gases from several sources $34(a) \ldots 34(n)$ via gas delivery lines 38 (only some of which are shown). In the particular example illustrated below, gas sources $34(a) \ldots 34(n)$ include separate sources for $SiH_4$, $O_2$, Ar and $NF_3$ as well as one or more sources for the extended cleaning process. As would be understood by a person of skill in the art, the actual sources used for sources $34(a) \ldots 34(n)$ and the actual connection of delivery lines 38 to chamber 13 varies depending on the deposition and cleaning processes executed within chamber 13. Gas flow from each source $34(a) \ldots 34(n)$ is controlled by one or more mass flow controllers (not shown) as is known to those of skill in the art.

Figure 2B:
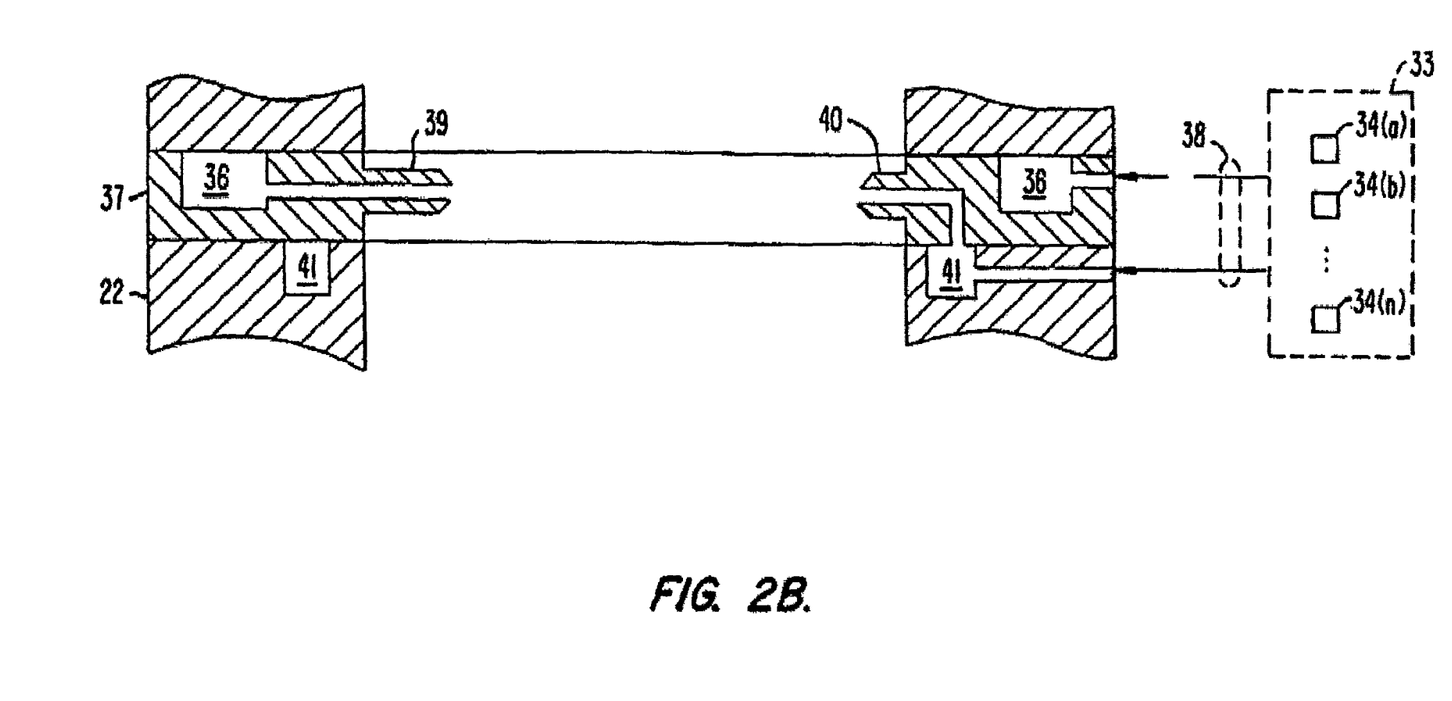
FIG. 2B is a simplified cross-sectional view of a gas ring that may be used in conjunction with the exemplary CVD processing chamber of FIG. 2A.

Gases are introduced into chamber 13 through a gas ring 37 and/or a top nozzle 45. FIG. 2B is a simplified, partial cross-sectional view of chamber 13 showing additional details of gas ring 37. In some embodiments, one or more gas sources provide gas to ring plenum 36 in gas ring 37 via gas delivery lines 38 (only some of which are shown). Gas ring 37 has a plurality of gas nozzles 39 (only one of which is shown for purposes of illustration) that provides a uniform flow of gas over the substrate. Nozzle length and nozzle angle may be changed to allow tailoring of the uniformity profile and gas utilization efficiency for a particular process within an individual chamber. In one specific embodiment, gas ring 37 has 24 gas nozzles 39 made from an aluminum oxide ceramic.

Gas ring 37 also has a plurality of gas nozzles 40 (only one of which is shown), which in a specific embodiment are co-planar with and shorter than source gas nozzles 39, and in one embodiment receive gas from body plenum 41. Gas nozzles 39 and 40 are not fluidly coupled in some embodiments where it is desirable to not mix gases (e.g., $SiH_4$ and $O_2$) introduced through gas ring 37 before injecting the gases into chamber 13. In other embodiments, gases may be mixed prior to injecting the gases into chamber 13 by providing apertures (not shown) between body plenum 41 and gas ring plenum 36. Additional valves, such as 43B (other valves not shown), may shut off gas from the flow controllers to the chamber.

In embodiments where flammable, toxic, or corrosive gases are used, it may be desirable to eliminate gas remaining in the gas delivery lines after a deposition or cleaning process. This may be accomplished using a 3-way valve, such as valve 43B, to isolate chamber 13 from a delivery line 38 and to vent delivery line 38 to vacuum foreline 44, for example. As shown in FIG. 2A, other similar valves, such as 43A and 43C, may be incorporated on other gas delivery lines. Such 3-way valves may be placed as close to chamber 13 and remote plasma source 50 as practical, to minimize the volume of the unvented gas delivery line (between the 3-way valve and the chamber). Additionally, two-way (on-off) valves (not shown) may be placed between a mass flow controller ("MFC") and the chamber or between a gas source and an MFC.

Referring again to FIG. 2A, chamber 13 also has top nozzle 45 and top vent 46. Top nozzle 45 and top vent 46 allow independent control of top and side flows of the gases, which improves film uniformity and allows fine adjustment of the film's deposition and doping parameters. Top vent 46 is an annular opening around top nozzle 45. In one embodiment, one source, e.g., $SiH_4$, supplies source gas nozzles 39 and top nozzle 45 through separate MFCs (not shown). Similarly, separate MFCs may be used to control the flow of oxygen to both top vent 46 and gas nozzles 40 from a single source of oxygen. The gases supplied to top nozzle 45 and top vent 46 may be kept separate prior to flowing the gases into chamber 13, or the gases may be mixed in top plenum 48 before they flow into chamber 13. In other embodiments, separate sources of the same gas may be used to supply various portions of the chamber.

A remote microwave-generated plasma cleaning system 50 is provided to periodically clean deposition residues from chamber components in a dry cleaning operation. The cleaning system includes a remote microwave generator 51 that creates a plasma from one or more cleaning gas source in sources 34(a) ... 34(n) (e.g., molecular fluorine, nitrogen trifluoride, other fluorocarbons or equivalents alone or in combination with another gas such as Argon) in reactor cavity 53. The reactive species resulting from this plasma are conveyed to chamber 13 through cleaning gas feed port 54 via applicator tube 55. The materials used to contain the cleaning plasma (e.g., cavity 53 and applicator tube 55) must be resistant to attack by the plasma. The distance between reactor cavity 53 and feed port 54 should be kept as short as practical, since the concentration of desirable plasma species may decline with distance from reactor cavity 53. Generating the cleaning plasma in a remote cavity allows the use of an efficient microwave generator and does not subject chamber components to the temperature, radiation, or bombardment of the glow discharge that may be present in a plasma formed in situ. Consequently, relatively sensitive components, such as electrostatic chuck 20, do not need to be covered with a dummy wafer or otherwise protected, as may be required with an in situ plasma cleaning process.

System controller 60 controls the operation of system 10. Controller 60 may include, for example, a memory 62, such as a hard disk drive and/or a floppy disk drive and a card rack coupled to a processor 61. The card rack may contain a single-board computer (SBC), analog and digital input/output boards, interface boards and stepper motor controller boards. System controller 60 operates under the control of a computer program stored on the hard disk drive or through other computer programs, such as programs stored on a removable disk. The computer program dictates, for example, the timing, mixture of gases, RF power levels and other parameters of a particular process.

Depositing a Silicon Oxide Film According to Specific Embodiments of the Invention As described further herein, a silicon oxide film may be deposited for very aggressive gapfill applications. For example in some embodiments, a silicon oxide film may be deposited for STI applications (prior to formation of metal signal lines over the substrate) in gaps of less than 65 nm at the top of the trench.

As previously stated, embodiments of the present invention can be practiced in an HDP-CVD chamber such as exemplary chamber 13 described above. For convenience, a graphical overview of deposition and etching in accordance with the invention is described with respect to FIG. 3.

Figure 3:
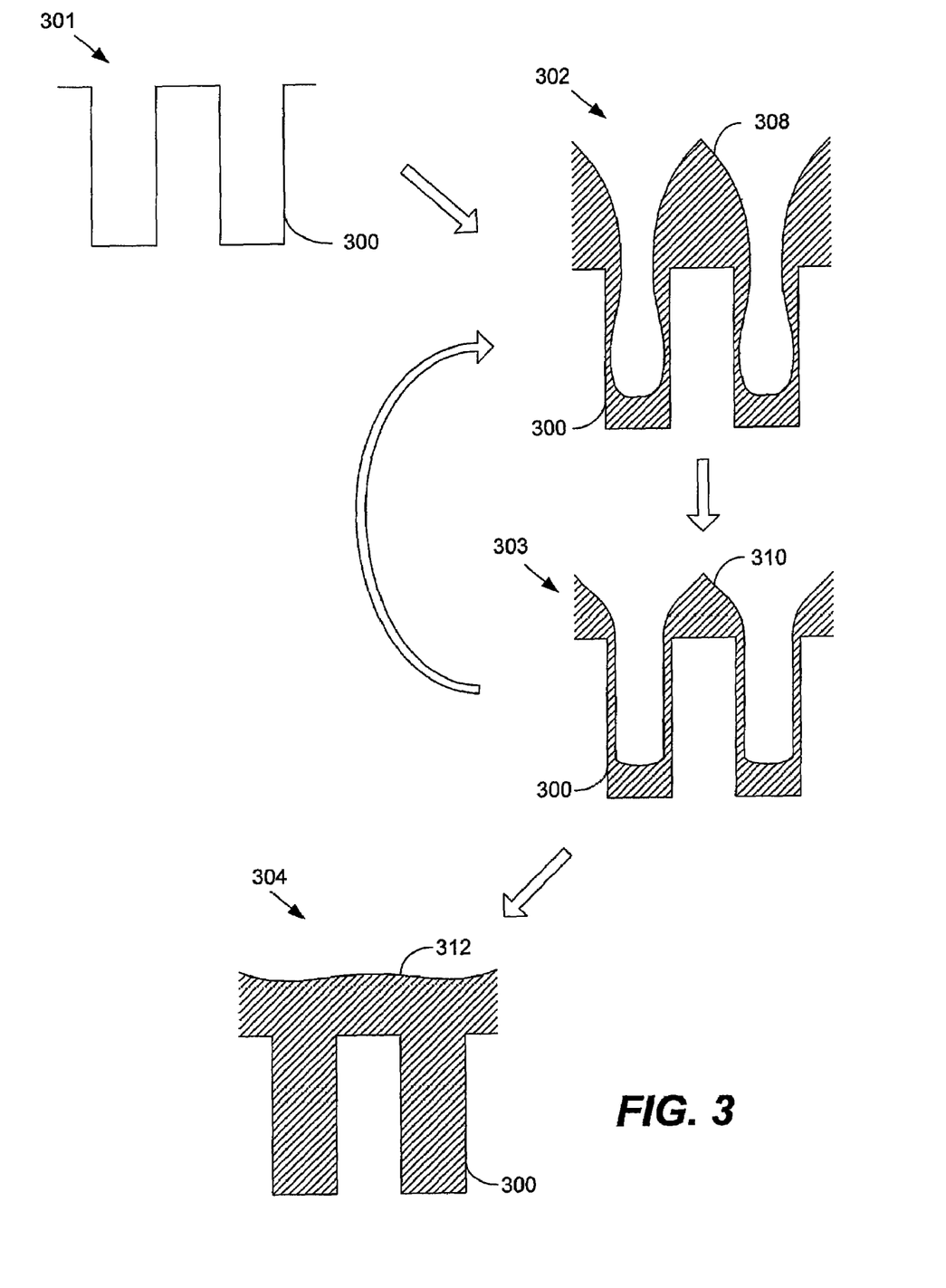
FIG. 3 provides schematic cross-sectional drawings illustrating how a high-aspect-ratio feature may be filled using a process according to an embodiment of the invention.

Cross-section 301 of a trench 300 on a substrate shows the initial condition. Although described with respect to deposition on one or more "gaps" or "trenches" the invention is not limited to shallow trench isolation, but may be applied to deposition on virtually any structure on the substrate. Adjacent features define trenches 300 that are to be filled with dielectric material, with the sidewalls of the trenches 300 being defined by the surfaces of the features. The trenches 300 in substrate may comprise silicon, or silicon with a nitride barrier layer, for example.

As shown by cross-section 302, as deposition proceeds, dielectric material accumulates on cusps 308 of the uppermost surfaces of the trenches 300 (referred to colloquially as forming "hats" on the trenches 300) as well on the bottom of the trenches 300. The dielectric material may also form overhangs at the corners of the trenches 300 due to re-deposition of material sputtered from the cusps 308.

As described further below, in contrast to conventional DED processes that generally prefer higher temperatures to improve bottom-up gapfill, deposition in accordance with the present invention is performed at low temperatures, which can yield several advantages. For example, lower deposition temperatures may provide improved sidewall coverage, which prevents the subsequent etch from damaging the underlying structure. Further, film stress may be improved by depositing at low temperatures. Conventional high temperature deposition generally yields compressive stress in the film and exceeds the stress limit (typically 250 MPa) for IC processing. On the other hand, low temperature deposition can give good gap fill with relatively low stress (e.g., 150-200 MPa).

Cross-section 303 shows etching used to reduce the aspect ratio of the deposited material. The reduced cusp 310 is protective during the etching step, which results in cross-section 303. Performing the etch anisotropically, such as by applying a bias during a reactive etch, helps to shape the deposited layer so that the basic shape of the original trench 300 is retained, but with less severe aspect ratio, and with the corners of the underlying trench 300 remaining unexposed.

As shown by the upward arching arrow, the deposition and etching steps described above are cycled a predetermined number of times to fill the trench 300. The number of cycles may be determined based upon an analysis of the individual deposition and etching steps described above versus the total depth of the trench 300. For example, with 750 Å of deposition and 250 Å of etching in each cycle, providing 500 Å of deposition in each cycle, approximately 7 repetitions of the cycle would fill a trench of approximately 4000 Å in depth. When the predetermined number of cycles has been completed, the trench 300 may be partially or completely filled with dielectric material 312 without significant voids, such as shown schematically with cross-section 304.

Figure 4:
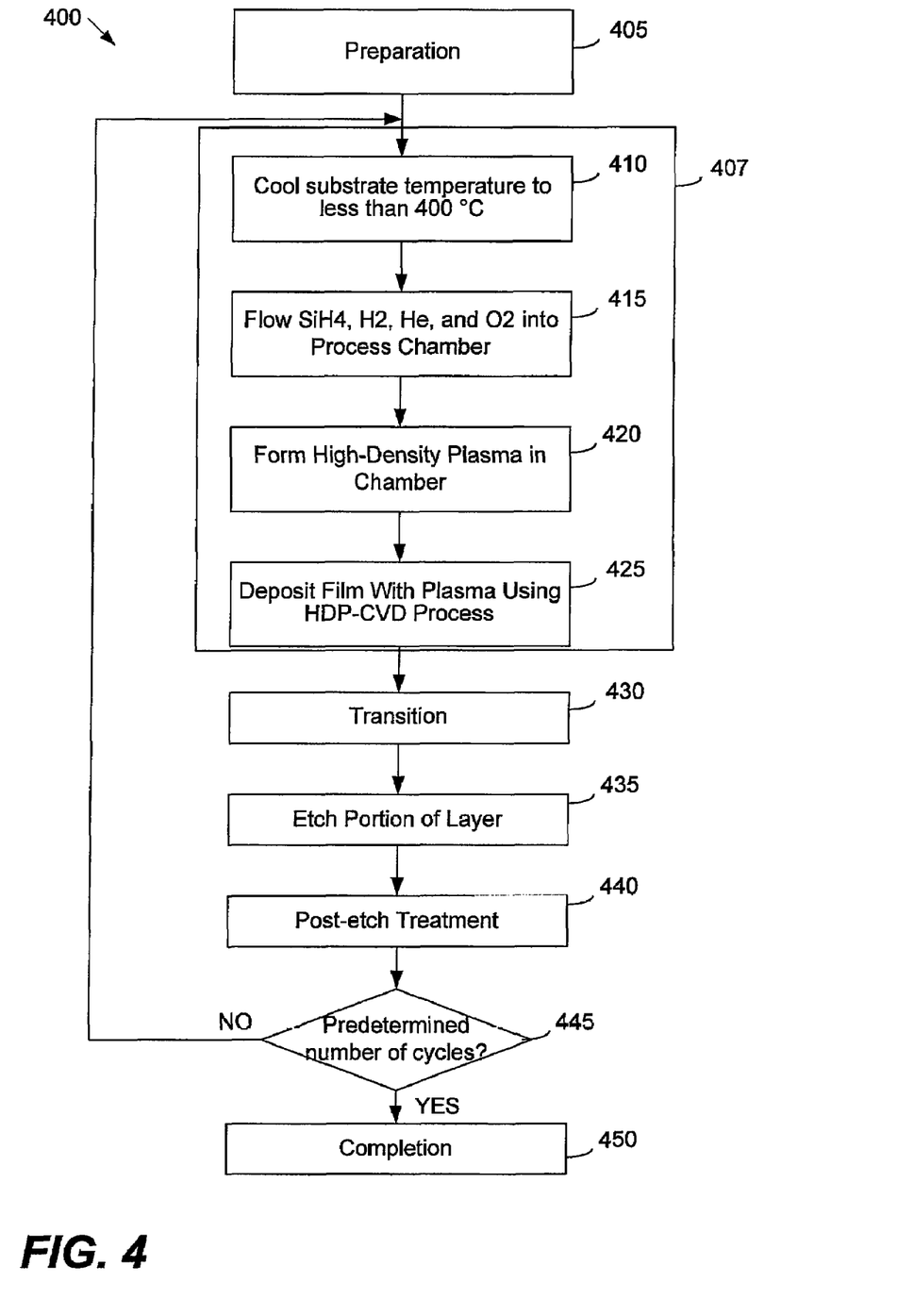
FIG. 4 is a flowchart illustrating various steps associated with the repeated cycling of low-temperature deposition and etching of a silicon oxide film according to one embodiment of the invention.

FIG. 4 is a flowchart illustrating a method 400 for repeated cycling of low-temperature deposition and etching of a silicon oxide film according to one embodiment of the invention. Where applicable, reference numbers in the description below are used to refer to appropriate components of the exemplary chamber 13 of FIGS. 2A-2B. In this embodiment the process is implemented and controlled using a computer program stored in memory 62 of system controller 60.

The method 400 is summarized for one embodiment with the flow diagram shown in FIG. 4. The method is for exemplary purposes only and is not intended to limit the scope of the claims of the present invention. At step 405, one or more preparatory steps are executed to prepare for the subsequent cycles of deposition and etching processes. For example, step 405 includes transferring the substrate upon which the silicon oxide layer is to be deposited into deposition chamber 13, and may include processes such as stabilizing chamber pressure, and the like.

Once the substrate and chamber 13 are stabilized, an initial deposition 407 commences. At step 410, substrate temperature is stabilized by cooling the substrate to a deposition temperature less than 400° C. Lower temperature deposition generally improves coverage on sidewalls (as compared to higher temperature deposition) and prevents subsequent etching step 435 from damaging the underlying structure. In some embodiments, the film is deposited with the substrate cooled to less than 400° C, and even significantly less than 290° C. or even at temperatures approaching room temperature. As noted below, one method for cooling the substrate is by flowing He backside cooling gas and/or cooling water via the substrate support 18. Further, it is believed that deposition as low as room temperature or below may be beneficial for strain engineering applications, as described further below.

At step 415, deposition process gases comprising $SiH_4$ as a silicon source, along with $H_2$, He, and $O_2$, are flowed into the process chamber 13. Suitable flow rates for the different precursor gases may vary depending on specific applications, specific structures on the substrate, on the design of the chamber in which the deposition is performed, and other considerations, as described further herein. In an embodiment in which the silicon source comprises $SiH_4$ and the oxidizing gas reactant comprises $O_2$, suitable flow rates $\Phi$ are within the ranges: for $SiH_4$, the flow rate $\Phi(SiH_4)$ for the chamber design described with respect to FIG. 2 may be between about 15 and 100 sccm; for $O_2$, the flow rate $\Phi(O_2)$ may be between about 25 and 500 sccm; for He, the flow rate $\Phi(He)$ may be between about 200 and 400 sccm; and for $H_2$, the flow rate $\Phi(H_2)$ may be between about 100 and 200 sccm. While the gas flow ranges set forth broad parameters for the flow rates, the specific flow rates may be determined as described further herein, depending on the specific chamber configuration.

In some embodiments, rather than using $H_2$ and He, $H_2$ only is used with $SiH_4$ and $O_2$. In some embodiments the deposition may include Ar, Xe, or other inert gases, but generally such inert gases provide a relatively high sputter component, which may need to be compensated for with low bias power, yielding relatively poor film quality.

Providing both $H_2$ and He gases in the deposition gases provides an adjustment "knob" for controlling a deposition/sputter (D/S) ratio. D/S ratio is dependent on bias power, and is preferably in the range of 10:1 to 60:1. A D/S ratio of 30:1, for example, may be determined by measuring a deposition rate caused by all deposition gases, as compared to a sputter rate caused by the deposition gases less $SiH_4$. Generally, film quality suffers with a high D/S ratio, and an unbiased process tends to give Si-rich porous film. The D/S ratio for deposition step 407 may be tuned to give sufficient coverage on sidewalls of trenches 300 (FIG. 3), for example, that protects the nitride liner while at the same time reducing the aspect ratio of trenches 300 with successive cycles of deposition and etch.

In step 420, a high density plasma is formed in chamber 13 with the process gases. In some embodiments, high RF power (e.g., up to 30 kW total of top, side, and bias RF power) may be used to improve bottom-up coverage. However, high total RF power tends to increase temperature of the substrate and tends toward compressive stress in the film. Therefore, in a preferred embodiment, total RF power of approximately 17.5 kW is applied, for a 300 mm substrate.

In step 425, deposition of the film takes place on the substrate. The amount of coverage on the sidewalls of the trench 300 versus bottom coverage is one consideration for the deposition conditions. Generally, the deposition conditions are selected to minimize deposition on cusps 308 (FIG. 3) since material from the cusps 308 may contribute to re-entrant growth of overhangs. The deposition conditions are also selected to provide sufficient film on sidewalls, e.g. to protect the nitride liner in the trench 300.

In one experiment, STI test pattern wafers were used with trenches etched to approximately 90 nm spacing in silicon and with a depth of about 600 nm. Spacings were further tightened through the addition of an ISSG (in-situ steam generation) oxide liner (~150 Å) and an LPCVD (low-pressure chemical vapor deposition) nitride liner (~250Å). On such test pattern wafers, the amount of dielectric material deposited in step 407 was 500-750 Å, with approximately 30% of this amount deposited on sidewalls of the trenches. This deposition thickness provided an acceptable balance between minimized deposition on cusps 308 and protection of the nitride liner with deposition on the sidewalls. In this experiment, substrate temperature monitoring equipment in the chamber was not able to measure temperatures below 290° C. In such case, it is known that the substrate was cooled to below 290° C., but the actual temperature of the substrate could not be determined.

Subsequent to the deposition steps 407, a transition step 430 is optionally included to smoothly transition to the upcoming etching step 435. In one embodiment, transition step 430 ramps down $O_2$ flow rate and adjusts $H_2$ & He flows to match the flow rates used in the upcoming etching step 435. For example, transition step 430 may provide for the introduction of $NF_3$ into the chamber without having $SiH_4$ in chamber, to prevent the formation of $SiF_4$ on the substrate.

At step 435, etching commences with a high density plasma etch. Approximately 5 to 30% of the deposited thickness of the film is removed during etching step 435, although the amount removed may vary at different points according to the profile of the film. In certain embodiments, a nitrofluorinated gas such as $NF_3$ or a carbofluorinated gas such as $C_2F_6$, $C_3F_8$, or $CF_4$, is flowed into the process chamber. CF chemistry generally yields a more selective etch of silicon oxide with respect to silicon nitride.

Generally, $H_2$ and/or He may be added during etching step 435 to reduce the sputter component of the etch and provide another tuning knob for the overall process. In contrast to a traditional $Ar/NF_3$ etch or $Ar/O_2/NF_3$ etch, the inventors have determined that because fluorine is a relatively large atom with a large sputter component, the controlled addition of $H_2$ and/or He advantageously provides a reduction in the sputter component of the etching step 435. Reducing the fluorine concentration (using relatively higher concentrations of $H_2$ and $N_2$) provides more of a sputtering component to the etching step 435, while increasing the fluorine concentration provides a more anisotropic component to the etching step 435. In some embodiments, the etching step 435 uses relatively more $H_2$ because $H_2$ scavenges some of the fluorine and provides a more selective etch.

Control of wafer bias power, electrostatic chuck voltage, and RF power may also be used to control whether the etching step 435 is isotropic or anisotropic. The characteristics of the etch process may be tuned to provide more or less of a sputtering (directional) etch versus an anisotropic etch (less directional), depending on the depth and angle of the trench. The particular ratios for deposition and etch components may be determined experimentally based upon trench depth, width, and angle.

Etching step 435 may include cooling to prevent heating of the substrate in a subsequent deposition step (e.g., dep2). Such cooling may be performed, for example, by helium backside cooling of the substrate, among other methods. In some instances, the etching may be also be preceded by a cooling step to lower the temperature of the substrate below about 250° C. and thereby provide better etch control.

In other embodiments, substrate cooling during etching step 435 may be disabled so that the substrate is allowed to heat up during etching step 435. Allowing the substrate to heat up during etching step 435 improves removal of fluorine from the film, since at lower temperatures fluorine is more easily incorporated into the film. In other words, the temperature profile of the substrate may be such that the substrate is actively cooled during deposition steps 407, the substrate may be passively or actively heated during etching step 435 to remove fluorine, and then the substrate may be cooled again in subsequent deposition steps (e.g., dep2).

Etching step 435 may comprise multiple step etch processes. Generally, there are two processes simultaneously occurring during etching step 435: an isotropic (e.g., fluorine-based) etching component and a sputtering etch aspect (e.g., by He). Instead of simultaneously occurring processes, etching step 435 may be divided into two separate etch steps, initially using a relatively high fluorine concentration to reduce the size of cusps 308 (FIG. 3), followed by a relatively more isotropic etch component to provide etch uniformity.

The duration of etching step 435 (etch time) is generally dependent on etch rate, gas flows, top/side/bottom power, etc. The duration of etching step 435 may also be dependent on whether the etch provides anisotropic versus isotropic etch and/or etch rates at center to edge of the substrate.

In some embodiments, termination of etching step 435 for the initial cycle is performed by an endpoint technique, and termination of etching step 435 for subsequent cycles is performed based on time. For example, etching step 435 in the initial cycle may be terminated using optical emission spectrography (OES) that detects when etching step 435 has etched through to the underlying nitride layer in trench 300. The OES endpoint is used to determine a baseline etch time. Thereafter, in subsequent cycles of deposition and etching, the etching step 435 is terminated based upon a function of the baseline etch time.

In other words, in the initial cycle of etching step 435 (etch1), OES data may be used to determine the baseline etching time needed to reach the underlying nitride layer. The duration for each subsequent cycle of etching step 435 (etch2, etch3, etc.) may be the same time as the baseline etching time, or a predetermined amount more or less than the baseline etching time. For example, if etch1 takes 10 seconds to etch down to the nitride layer, as determined by endpoint, then etch2, etch3, and so on may use 9 seconds as a fixed amount of etching time.

In alternative embodiments, the duration of subsequent etch cycles may be a geometric variation on the baseline etch time. For example, etch2 may use a timed etch with duration 20% less than the baseline etch time, etch3 may use a timed etch with a duration 20% less than the second etch cycle, and so on. Providing a geometric variation on the baseline etch time may provide an incrementally decreasing aspect ratio in the trench 300 with subsequent cycles.

In still other embodiments, where chamber 13 is not cleaned after each wafer, the etch time for subsequent wafers may be variable depending upon the number of substrates processed after the clean. For example, the first substrate after cleaning may be etched for 10 seconds, the second substrate after cleaning may be etched for 11 seconds, and so on. The amount of etching time used in etching step 435 may depend therefore, on build up of deposition within the chamber 13.

Subsequent to the etching step 435, a post-etch treatment step 440 prepares the substrate for subsequent deposition steps. Post-etch treatment step 440 includes a plasma treatment to reduce or eliminate fluorine incorporated into the film during the etching step 435. The plasma treatment may include plasma treatment using one or more of $O_2$, Ar, $H_2$, and He to decrease fluorine in the film. Providing plasma treatment of $H_2$ may include sputtering the substrate to change the profile on the substrate.

At step 445, a determination is made whether a predetermined number of cycles of deposition and etching have been completed. The number of cycles may be determined based upon an analysis of the individual deposition and etching steps described above versus the total depth of the trench. For example, with 750 Å of deposition and 250 Å of etching in each cycle through steps 410-445, leaving 500 Å of deposition in each cycle, it would take approximately 7 repetitions of the cycle to fill a trench of approximately 4000 Å in depth.

After the predetermined number of cycles of deposition and etching have been completed, completion step 450 may optionally be included to prepare the substrate for further processing. For example, completion step 450 may include conventional blanket deposition processes to account for a total film thickness required, or for planarization processes such as chemical mechanical planarization (CMP).

The specific order of the blocks shown in FIG. 2 is not intended to be restrictive and in other embodiments, the corresponding steps may be performed in an alternative order. For example, cooling the substrate to a temperature less than 400° C. as indicated at step 410 may be performed contemporaneously with or after flowing the gas reactants into the process chamber 13 at step 415. Furthermore, the inclusion of specific blocks in FIG. 4 is not intended to be restrictive since additional steps may be performed in alternative embodiments.

As described above, although step 410 provides for cooling the substrate to less than 290°C., it is believed that benefits may be provided by cooling the substrate down to room temperature or below. Conventionally, cooling the substrate to such low temperatures would tend to provide a tensile film and poor film quality. However, it is believed that providing a high power plasma in completion step 450 after cycling through the predetermined number of deposition and etching steps may be sufficient to eliminate moisture in the deposited film, which would yield a tensile film. Alternatively, the high power plasma may be performed before the predetermined number of cycles has been completed. For example, with a total of 7 cycles of deposition and etching, the high power plasma may be performed after cycles 1, 3, 5, and 7. It is believed that very low temperature processing with subsequent modification of the as-deposited film may be important for strain engineering in future IC process applications.

Chamber 13 conditions such as seasoning and cleaning can impact performance of method 400. In some embodiments, chamber 13 is cleaned with a two-step clean, in which a low pressure clean and a relatively higher pressure clean are programmed to separately clean the chamber lid and walls or other parts of chamber 13. The cleaning may be followed by SiH$_4$ deposition and purge steps to appropriately season chamber 13. Cleaning may incorporate heating of chamber 13 to increase cleaning performance.

In some embodiments, chamber 13 is preferably seasoned before starting the method 400, or after a number of wafers have been processed. In some embodiments, seasoning comprises coating the chamber with a silicon-rich deposit to prevent attack of the chamber by etching gases used in etching the portion of the layer, with a seasoning deposition in the chamber that is 4 to 20 times thicker than a deposition thickness of a single deposition-etching cycle. Seasoning of the chamber can prevent drift in method 400 over time from wafer-to-wafer, since etch cycling changes the conditions in chamber 13. For example, etching steps 435 may cause the chamber walls to be cleaned more or less than the chamber ceiling. Further, method 400 uses high RF source power, highly oxidizing plasmas with O$_2$ and H$_2$ during deposition, and highly reducing fluorine during etching steps 435. Few commercially practical materials can stand up to such extreme conditions. Seasoning allows the method 400 to work with commercially practical components in chamber 13.

Process Optimization

In method 400, deposition step 407 and etching step 435 are designed to prevent damage the underlying structures during the etching step 435. This may be accomplished with a combination of effects. Deposition step 407 is designed to ensure that sufficient material is deposited to protect the underlying structures. Conditions established during the etching step 435 are designed to not etch away so much material that underlying structures of trench 300 (FIG. 3) are exposed.

In other words, factors to optimize in gapfill performance for a given structure on a substrate with method 400 are typically deposition thickness and etch removal amount. For a given deposition amount, there is an optimal amount of etch removal. If the etch does not remove enough deposited material, then the trench is not opened and subsequent depositions will deleteriously add to the cusping effect and leave behind a void. If the etch removes too much deposited material, any protective layers on the structure (e.g., nitride liner) may be attacked and the device may be damaged. The optimum etch amount should be determined for each etch condition and each deposition condition and thickness.

For example in one experiment, 275 Å of removal in each cycle of etching step 435 provided completely-filled trenches 300. However, with only 200 Å of removal in each etching step 435, a void was formed within the trench 300 at the edge of the substrate. Thus, the amount of etching performed during etching step 435 impacts the number of required cycles to achieve a given amount of deposition thickness (more etching means slower deposition growth and increases the number of cycles), and also impacts whether voids may be formed in the trenches 300. Generally, relatively small amounts of deposition (<1000 Å per cycle) and correspondingly small amounts of etching (preferably approximately 5-15% of the deposited thickness of the film) yield more "bottom-up" deposition and prevent void formation in narrow or "tight" trench structures.

To determine optimal processes, a method of process development may take the following general procedure, with respect to FIGS. 3 and 4. First, on a test pattern substrate, perform a single iteration of deposition, using steps 410-425. For the deposited film, measure bottom coverage, sidewall coverage, and height of the cusps 308. Then, perform a single iteration of etching step 435, and measure to determine an amount of removal at the bottom, on sidewalls, and of the cusps 308. Using the deposition measurements and the etch measurements, independently optimize the deposition steps 410-425 and the etching step 435 for the smallest structure on the substrate or the structure with the highest aspect ratio.

An advantage of the method 400 is ease of use. In contrast to conventional DED processes that typically require qualification of each step in the overall process, some embodiments of the method 400 described herein provide ease of use in operation and ease of qualification. In the method 400, once the deposition and etch steps are optimized for a particular structure on substrate, the only parameters that may be adjusted by an operator are the deposition time and etch time. A controller of the HDP-CVD reactor may be programmed to allow repetitive, rapid, and accurate deposition and etch cycling, for ease of process management.

Another advantage of the method 400 is that relatively low deposition temperature provides a greater degree of protection of the underlying trench features (e.g., nitride liner) than the higher wafer temperatures used in conventional DED processes. With a cooler deposition, sidewall coverage is increased, providing better protection to the active area and allowing the gapfill to proceed without damage. The opposite is true with high temperature deposition where sidewalls are less protected and clipping of edges may be obvious.

Those of ordinary skill in the art will realize that processing parameters can vary for different processing chambers and different processing conditions, and that different precursors can be used without departing from the spirit of the invention. Other variations will also be apparent to persons of skill in the art. These equivalents and alternatives are intended to be included within the scope of the present invention. Therefore, the scope of this invention should not be limited to the embodiments described, but should instead be defined by the following claims.

What is claimed is:

1. A method for filling a pre-metal deposition trench formed on a substrate, comprising:
   executing a cycle including:
      depositing a layer on the substrate in a high density CVD chamber, the substrate cooled to less than 400° C., and
      etching a portion of the deposited layer on the substrate in the chamber; and
   repeating the cycle of depositing the layer and etching the portion of the layer for a predetermined number of cycles.

2. The method of claim 1 wherein repeating the cycle of depositing the layer and etching the portion of the layer comprises establishing substantially the same process conditions as used in one or more initial cycles.

3. The method of claim 1 further comprising flowing a backside cooling gas to cool a platform thermally coupled to the substrate.

4. The method of claim 1 wherein depositing the layer comprises generating a plasma including deposition gases and sputtering gases, wherein a ratio of depositing to sputtering is in the range of 10:1 to 60:1.

5. The method of claim 1 wherein each successive cycle of depositing and etching includes decreasing an aspect ratio of the trench filled by the layer.

6. The method of claim 1 wherein:
   depositing the layer comprises depositing material adjacent an opening of the trench, on a sidewall of the trench, and on a bottom of the trench; and etching comprises removing a relatively larger portion of the deposited material from adjacent the opening of the trench than the bottom of the trench.

7. The method of claim 1 wherein etching comprises establishing a plasma of a fluorine-containing gas and one or more of hydrogen and helium.

8. The method of claim 1 etching the portion of the deposited layer comprises removing from 5 to 30% of the deposited thickness of the layer.

9. The method of claim 1 wherein etching comprises allowing the substrate to heat to a temperature above the deposition temperature.

10. The method of claim 1 wherein etching comprises a multi-step etch of an anisotropic etch and an isotropic etch.

11. The method of claim 1 wherein the portion of the deposited layer etched in a first etch cycle is greater than a portion of the deposited layer etched in a subsequent etch cycle.

12. The method of claim 1 wherein etching the portion of the deposited layer in a first depositing-etching cycle is stopped by an endpoint technique, and etching a portion of the deposited layer in a subsequent depositing-etching cycle is stopped by time.

13. The method of claim 1 further comprising, before repeating the depositing-etching cycle, establishing a plasma of oxygen and one or more of argon, hydrogen, and helium.

14. The method of claim 1 further comprising, before repeating the depositing-etching cycle, establishing a sputtering plasma of hydrogen.

15. The method of claim 1 wherein depositing the layer comprises cooling the substrate to less than 300° C., further comprising, after repeating the depositing-etching cycle the predetermined number of cycles, heating the substrate to reduce moisture in the layer.

16. The method of claim 1 farther comprising, after repeating the depositing-etching cycle the predetermined number of cycles, depositing a blanket layer.

17. The method of claim 15 wherein heating the substrate comprises generating a high-power plasma of deposition gases or one or more noble gases in the chamber.

18. The method of claim 1 further comprising, before initiating the depositing-etching cycle, seasoning the chamber with a silicon-rich deposit to prevent attack of the chamber by etching gases used in etching the portion of the layer.

19. The method of claim 18 wherein seasoning the chamber comprises depositing a thickness of deposit in the chamber 4 to 20 times thicker than a deposition rate of the layer.

20. The method of claim 1 wherein depositing the layer comprises depositing less than about 1000 Å in each cycle.

21. The method of claim 1 wherein etching the portion of the layer comprises forming a plasma of one or more fluorocarbon etch gases.

* * * * *